United States Patent [19]

Schouwenaars et al.

[11] Patent Number: 4,864,215
[45] Date of Patent: Sep. 5, 1989

[54] CURRENT SOURCE ARRANGEMENT

[75] Inventors: Hendrikus J. Schouwenaars; Eise C. Dijkmans; Dirk W. J. Groeneveld, all of Eindhoven, Netherlands

[73] Assignee: U.S. Philips Corp., New York, N.Y.

[21] Appl. No.: 193,382

[22] Filed: May 12, 1988

[30] Foreign Application Priority Data

Feb. 16, 1988 [NL] Netherlands ............... 8800370

[51] Int. Cl.[4] ............... G05F 3/16; H03K 13/02
[52] U.S. Cl. ................... 323/312; 323/317; 341/144; 341/148
[58] Field of Search ............... 323/312, 315, 316, 317; 341/135, 144, 148

[56] References Cited

U.S. PATENT DOCUMENTS 3,995,304 11/1976 Pease ............... 357/36
4,393,370 7/1983 Hareyama ............... 341/148 X
4,587,477 5/1986 Hornak et al. ............... 323/312
4,701,636 10/1987 Millhollan et al. ............... 323/312
4,703,310 10/1987 van de Plassche ............... 323/317
4,712,091 12/1987 Schoofs et al. ............... 323/312

OTHER PUBLICATIONS

Saul et al., "An 8b CMOS Video DAC", ISSCC 1985, Digest of Technical Papers, pp. 32–34.

Primary Examiner—Peter S. Wong
Attorney, Agent, or Firm—Bernard Franzblau

[57] ABSTRACT

A current source arrangement in which the equality of a number of current sources (1–8) constituted by transistors is improved in that each of these current sources (1–8) is constituted by a number of transistors which are arranged regularly in a matrix on the surface area of an integrated circuit.

3 Claims, 2 Drawing Sheets

| 1 | 5 | 7 | 3 | 8 | 4 | 6 | 2 |
|---|---|---|---|---|---|---|---|
| 2 | 6 | 8 | 4 | 1 | 5 | 7 | 3 |
| 3 | 7 | 1 | 5 | 2 | 6 | 8 | 4 |
| 4 | 8 | 2 | 6 | 3 | 7 | 1 | 5 |
| 5 | 1 | 3 | 7 | 4 | 8 | 2 | 6 |
| 6 | 2 | 4 | 8 | 5 | 1 | 3 | 7 |
| 7 | 3 | 5 | 1 | 6 | 2 | 4 | 8 |
| 8 | 4 | 6 | 2 | 7 | 3 | 5 | 1 |
| 1 | 5 | 7 | 3 | 8 | 4 | 6 | 2 |
| 2 | 6 | 8 | 4 | 1 | 5 | 7 | 3 |
| 3 | 7 | 1 | 5 | 2 | 6 | 8 | 4 |
| 4 | 8 | 2 | 6 | 3 | 7 | 1 | 5 |
| 5 | 1 | 3 | 7 | 4 | 8 | 2 | 6 |
| 6 | 2 | 4 | 8 | 5 | 1 | 3 | 7 |
| 7 | 3 | 5 | 1 | 6 | 2 | 4 | 8 |
| 8 | 4 | 6 | 2 | 7 | 3 | 5 | 1 |

FIG. 4

CURRENT SOURCE ARRANGEMENT

BACKGROUND OF THE INVENTION

This invention relates to a current source arrangement comprising N current sources ($N \geq 1$) for generating N substantially equal currents, said sources comprising $N \times M$ substantially equal current source transistors. The invention also relates to a digital-to-analog converter comprising such a current source arrangement.

Such a current source arrangement provides the possibility of realizing a digital-to-analog converter by applying the currents of the current source transistors to a summing point via switches controlled by the digital input code or by draining them to a power supply terminal. The current occurring at the summing point then constitutes the output signal corresponding to the digital input code. In such a converter one current source is connected in circuit upon each increase of the digital input code. The converter is therefore monotonic throughout the range of the input code.

A converter of this type requires such a large number of current sources and switches for achieving a high resolution that such a converter can hardly be realized. Approximately 1024 current sources are required for, for example, a 10-bit digital-to-analog converter.

To achieve a high resolution with a limited number of current sources, the least significant bits are often realized by splitting up the current of one of the current sources by means of, for example, a binary current divider. For example, a 10-bit converter can be built up from 8 equal current sources, by using the currents of 7 current sources to form the 3 most significant bits and by applying the current of the remaining current source to a binary current divider to form the 7 least significant bits.

To prevent monotonic errors in such a converter, the current of each current source of the 3-bit part of the converter should be at least equal to the sum current of the 7-bit part of the converter. However, the mutual deviation between two current sources increases as the distance between these sources on the integrated circuit increases. Consequently, the deviation between the current source whose current is applied to a binary current divider and a current source located at a further distance can become so large that a monotonic error occurs. To prevent such errors it is known that, instead of applying a fixed current to the binary current divider, the current of the current source from the 3-bit part located next to the current source which is the last to be connected in circuit is applied to this divider. A digital-to-analog converter based on this principle is known from Digest of Technical Papers 1985 IEEE ISSCC, pp. 32-34. A drawback of such a converter is that a complex switching network of three-way switches is required for switching the currents of the current sources from the 3-bit part.

SUMMARY OF THE INVENTION

It is therefore an object of the invention to provide a current source arrangement for generating a number of currents which are accurately equal. According to the invention, a current source arrangement of a type described in the opening paragraph is therefore characterized in that the current source transistors are arranged in a matrix comprising R rows and K columns of matrix elements each comprising L current source transistors such that $N \times M = R \times K \times L$ and in that each row comprises $M/(R \times L)$ matrix elements and each column comprises $M/(K \times L)$ matrix elements of each current source with a substantially maximum possible distance between the matrix elements of said current source such that the centroid of all matrix elements associated with a given current source is located substantially in the centre of the matrix.

The influences of all kinds of gradients and variations such as temperature, doping concentration and oxide thickness gradients on the mutual ratios of the currents of the current sources are inhibited as much as possible by distributing the matrix elements associated with a current source as evenly as possible and with maximum possible mutual distances over the surface area of the integrated circuit.

It is to be noted that a binary current source arrangement whose transistors are arranged in a matrix such that the distance between the current source transistors and the centre increases as the intensity of the current source increases is known from U.S. Pat. No. 3,995,304. However, this is not a current source arrangement in which each current source transistor is constituted by a plurality of parallel-arranged transistors as in the arrangement according to the invention. Moreover, in the arrangement described in said Patent only the detrimental effects of linear temperature gradients are reduced and the detrimental effects of all kinds of non-linear gradients and variations are not inhibited.

Due to the greater equality of the current sources the risk of occurrence of monotonic errors is reduced considerably when using a current source arrangement according to the invention in a digital-to-analog converter.

BRIEF DESCRIPTION OF THE DRAWINGS

The invention will now be described in greater detail, by way of example, with reference to the accompanying drawings, in which:

FIG. 4 shows diagrammatically the arrangement of the transistors on the surface area of the integrated circuit in a current source arrangement according to the invention.

DESCRIPTION OF THE PREFERRED EMBODIMENT

Figure 1:
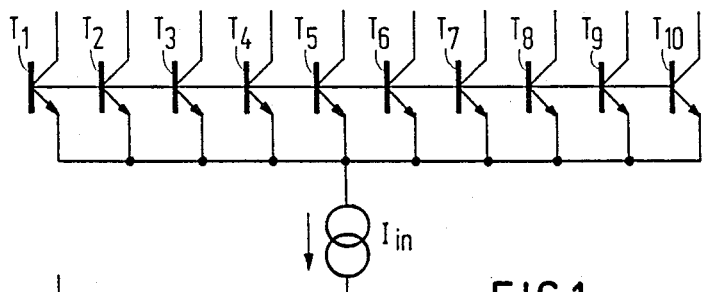
FIG. 1 is a first basic circuit diagram of a current source arrangement according to the invention.

FIG. 1 is a first basic circuit diagram of a current source arrangement according to the invention. This arrangement comprises about ten substantially equal current sources shown diagrammatically by means of the transistors $T_1$-$T_{10}$. Each transistor $T_1$-$T_{10}$ is constituted by a plurality of parallel-arranged transistors. The bases of the transistors are interconnected and the emitters of the transistors are connected to a common point to which an input current $I_{in}$ is applied. This input current $I_{in}$ is split up by the transistors $T_1$-$T_{10}$ into 10 substantially equal currents $I_{in}/10$ which constitute the output currents of the arrangement.

Figure 2:
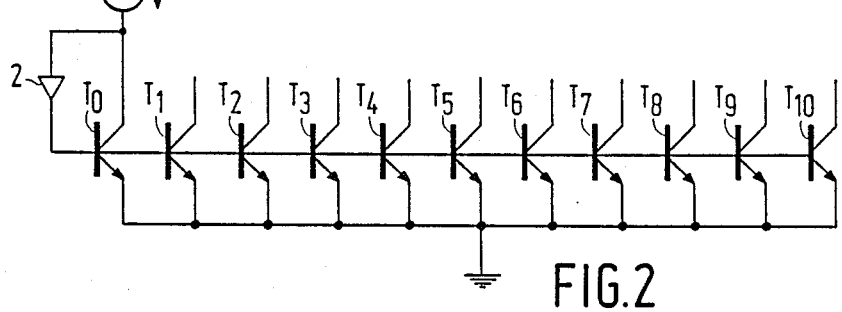
FIG. 2 is a second basic circuit diagram of a current source arrangement according to the invention.

FIG. 2 is a second basic circuit diagram of a current source arrangement according to the invention in which the same components have the same reference numerals as those in FIG. 1. The common base of the transistors $T_1$–$T_{10}$ conveys a fixed voltage which can be realized, for example, by means of a transistor $T_0$ whose base-emitter junction is arranged parallel to that of the transistors $T_1$–$T_{10}$ and whose collector is coupled to its base by means of an amplifier 2 and to a reference current source $I_{ref}$. The amplifier 2 controls the base of transistor $T_0$ in such a way that its collector current is accurately equal to the current $I_{ref}$. The collector currents of the transistors $T_1$–$T_{10}$ are a multiple of this current $I_{ref}$ which multiple is determined by the ratio between the total emitter surface of each of the transistors $T_1$–$T_{10}$ and the emitter surface of transistor $T_0$.

Figure 3:
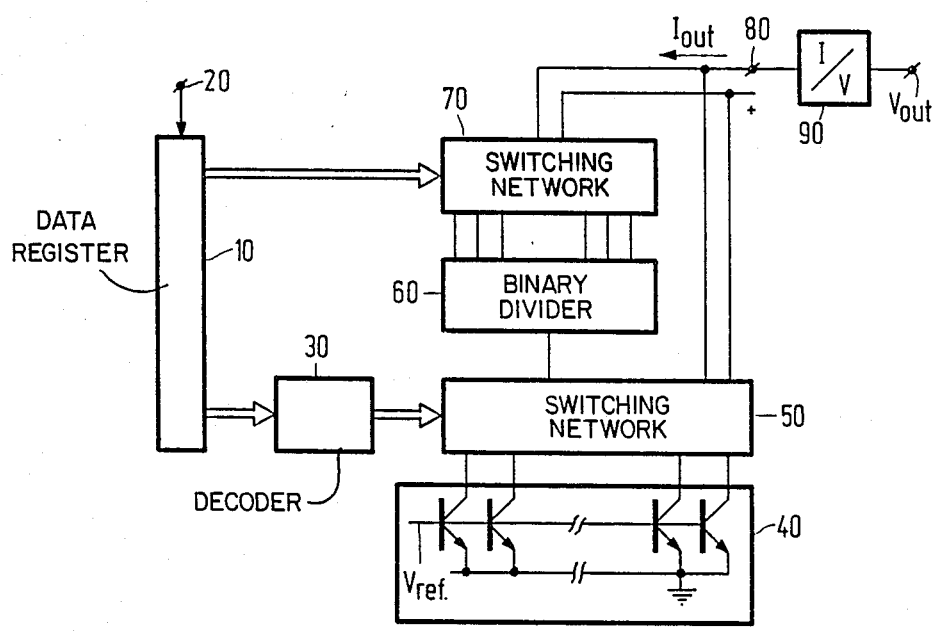
FIG. 3 shows a digital-to-analog converter comprising a current source arrangement according to the invention.

FIG. 3 shows diagrammatically a possible embodiment of a digital-to-analog converter comprising a current source arrangement shown in FIG. 2. This is a 10-bit D/A converter. The currents of the 3 most significant bits are supplied by a current source arrangement 40 which has a structure as shown in FIG. 2 and which supplies 8 substantially equal currents. Dependent on the digital input code, 7 currents are applied either to the summing point 80 or drained to the positive power supply terminal by means of a switching network 50 which is constituted by 8 two-way switches which are not shown for the sake of simplicity, whereas one of the currents is applied to an arrangement 60 which supplies the currents for the 7 least significant bits. The two-way switches are constituted, for example, by difference pairs, with the currents of the current source arrangement forming the tail currents of these difference pairs. The arrangement 60 may be constituted, for example, by a binary current divider whose currents, dependent on the digital input code, are applied either to the summing point 80 or drained to the positive power supply terminal by means of a switching network 70 comprising two-way switches which are not shown for the sake of simplicity. The total output currents $I_{out}$ occurring at the summing point can be converted into an output voltage $V_{out}$ by means of a current-voltage converter 90 which is shown diagrammatically.

It is to be noted that the arrangement 60 may not only be constituted by a binary current divider but also by an arrangement which applies the current applied thereto to the summing point for a period which is proportional to the least significant bits of the input code.

In this embodiment the 10-bit digital input word is serially applied to an input 20 of a data register 10. The 7 least significant bits directly control the switching network 70. The 3 most significant bits are first applied to a decoder 30 which derives the switching signals for the 7 switches of the switching network 50.

The maximal effective output current of the 7-bit part is 127/128 part of the current applied thereto. If the converter is to remain monotonic, each of the 7 currents of the 3-bit part may deviate less than 1/128 part from the current applied to the 7-bit part.

To realize this, each current source transistor comprises a plurality of parallel-arranged transistors arranged in a matrix in a given way. The principle of this arrangement will be explained with reference to a current source arrangement comprising 8 current sources each built up from 16 parallel-arranged transistors. Their arrangement is shown in FIG. 4 in which the interconnections of the transistors associated with a given current source are not shown for the sake of simplicity. The total number of 128 transistors is arranged in a matrix of 16 rows and 8 columns, each row comprising 1 transistor and each column comprising 2 transistors of each current source. All transistors associated with one current source have the same ordinal number. The mutual distance between the two transistors associated with one current source is chosen as large as possible. Furthermore, the transistors are arranged in such a way that the centroid of all transistors associated with a given current source is located substantially in the centre of the matrix.

When filling the matrix, the following procedure may, for example, be carried out. In the first column the two transistors associated with current source 1 are placed on the 1st and the 9th row, respectively. Subsequently the next pair of transistors of current source 1 are placed on the 5th and the 13th row in the 2nd column, hence at a maximum possible distance from the transistors in the first column. The two transistors of current source 1 are placed on the 3rd and the 11th row in the third column. It is to be noted that these transistors may in principle also be placed on the 7th and the 15th row. The arrangement of the transistors in the subsequent columns should then be adapted to this location. The transistors of the 4th column are then placed in the 7th and the 15th row, where these transistors are again at a maximum possible distance from the other transistors. The transistor in the 7th row is located substantially halfway between the transistors associated with the first current source in the 3rd column. In the same way the transistors of the first current source are arranged in the other columns. As the Figure clearly shows, the centroid of all transistors of current source 1 is located substantially in the centre of the matrix. The transistors of the other current sources are arranged in the same way, which is simply evident, starting from the arrangement according to ordinal number in the first column. The centroid of the transistors associated with these current sources is also located substantially in the centre of the matrix.

The principle shown can be easily extended to a larger number of current sources. In the case of a very large number of transistors per current source each element of the matrix may comprise a plurality of transistors of a current source so as to limit the complexity of the interconnections of the transistors associated with one given current source.

Due to the described distribution of the current source transistors each current source is built up from current source transistors which are distributed as evenly as possible over the surface area of the integrated circuit. Consequently, gradients and variations such as temperature, doping concentration and oxide thickness gradients and variations occurring across the surface area of the integrated circuit are distributed as evenly as possible over the current sources. The current sources are therefore more accurately equal to one another.

The described distribution of the transistors over the surface area of the integrated circuit has proved that a current source arrangement can be manufactured whose mutual current deviation was less than 1%. With this accuracy the occurrence of monotonic errors is prevented when using such a current source arrangement in a digital-to-analog converter.

The invention may be used both for current source arrangements comprising bipolar transistors and for current source arrangements comprising unipolar transistors. It is also to be noted that a digital-to-analog converter exclusively comprising a linear current source arrangement can be realized instead of a linear current source arrangement for the most significant bits and a binary current source arrangement for the least significant bits.

What is claimed is:

1. A current source arrangement comprising N current sources ($N \geq 1$) for generating N substantially equal currents, said current sources comprising $N \times M$ substantially equal current source transistors, characterized in that the current source transistors are arranged in a matrix comprising R rows and K columns of matrix elements each comprising L current source transistors such that $N \times M = R \times K \times L$ and in that each row comprises $M/(R \times L)$ matrix elements and each column comprises $M/(K \times L)$ matrix elements of each current source with a substantially maximum possible distance between the matrix elements of said current source such that the centroid of all matrix elements associated with a given current source is located substantially in the centre of the matrix.

2. A current source arrangement as claimed in claim 1 wherein $N=8$ and with each of said 8 current sources comprising 16 parallel arranged transistors with said transistors arranged in a matrix of 16 rows and 8 columns as shown in FIG. 4 of the drawing.

3. A digital-to-analog converter for converting an N-bit digital input signal into an analog output signal comprising, a current source arrangement for generating M substantially equal currents ($M \leq N$) for converting M bits of the N-bit digital input signal, a switching network for selectively coupling said current source arrangement to output means for summing selected currents received from said current source arrangement, and input means for receiving the digital input signal and for controlling the operation of said switching network in accordance with the digital input signal, and wherein said current source arrangement comprises:

M current sources ($M \geq 1$) for generating N substantially equal currents, said current sources comprising $M \times P$ substantially equal current source transistors, characterized in that the current source transistors are arranged in a matrix comprising R rows and K columns of matrix elements each comprising L current source transistors such that $M \times P = R \times K \times L$ and in that each row comprises $P/(K \times L)$ matrix elements and each volumn comprises $P/(K \times L)$ matrix elements of each current source with a substantially maximum possible distance between the matrix elements of said current source such that the centroid of all matrix elements associated with a given current source is located substantially in the center of the matrix.

* * * * *